United States Patent [19]
Gurkovich et al.

[11] Patent Number: 5,769,987
[45] Date of Patent: Jun. 23, 1998

[54] POST-FIRING METHOD FOR INTEGRATING PASSIVE DEVICES INTO CERAMIC ELECTRONIC PACKAGES

[75] Inventors: Stephen R. Gurkovich, Pittsburgh; Kenneth C. Radford, North Huntingdon, both of Pa.; Alex E. Bailey, Hampstead, Md.; Deborah P. Partlow, Export, Pa.; Andrew J. Piloto, Columbia, Md.

[73] Assignee: Northrop Grumman Cropration, Los Angeles, Calif.

[21] Appl. No.: 752,110
[22] Filed: Nov. 20, 1996
[51] Int. Cl.⁶ .................................................. B32B 31/26
[52] U.S. Cl. ..................... 156/89; 156/267; 156/306.6
[58] Field of Search .......................... 156/89, 267, 306.6; 264/614, 615, 616, 619

[56] References Cited

U.S. PATENT DOCUMENTS

| | | | |
|---|---|---|---|
| 4,459,166 | 7/1984 | Dietz et al. | 156/89 |
| 4,592,794 | 6/1986 | Davis et al. | 156/89 |
| 5,076,876 | 12/1991 | Dietz | 156/89 X |
| 5,601,673 | 2/1997 | Alexander | 156/89 |

OTHER PUBLICATIONS

"Monolithic Multicomponents Ceramic (MMC) Substrate" by Kazuaki Utsumi et al., *Ferroelectrics,* 1986, vol. 68, pp. 157–179.

"Multilayer Ceramic Substrate with Inner Capacitors" by Yoshihiro Fujioka et al., IMC 1992 Proceedings, Yokohama, Jun. 3–5, 1992, pp. 355–359.

*Primary Examiner*—Curtis Mayes
*Attorney, Agent, or Firm*—Walter G. Sutcliff

[57] ABSTRACT

We disclose a fabrication method for integrating passive devices such as capacitors, resistors and circulators into ceramic packages for electronic systems. The method utilizes a glass or glass/ceramic as a bonding agent which is incorporated as one of the layers in the multilayer package. The integration of such passive devices eliminates the tedious mounting of these devices on the package, permitting a smaller, more reliable, less expensive and lighter weight product. This method allows the integration of passive devices having firing temperatures far different from that of the ceramic package itself, permitting combinations of materials that cannot be densified, or cofired together.

18 Claims, 3 Drawing Sheets

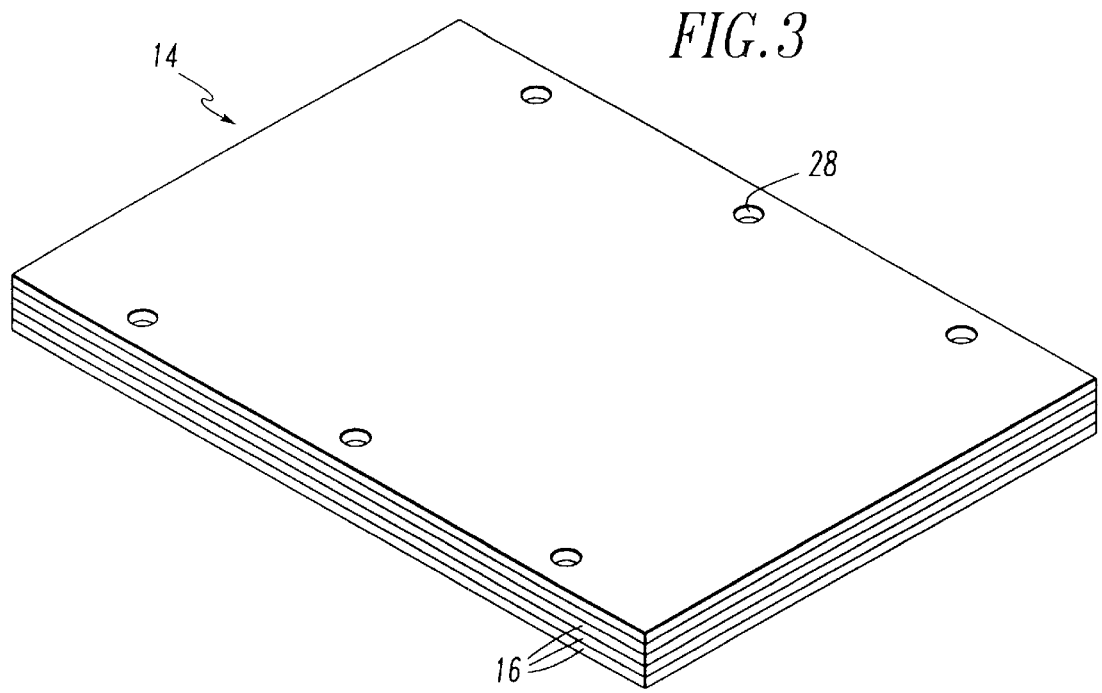
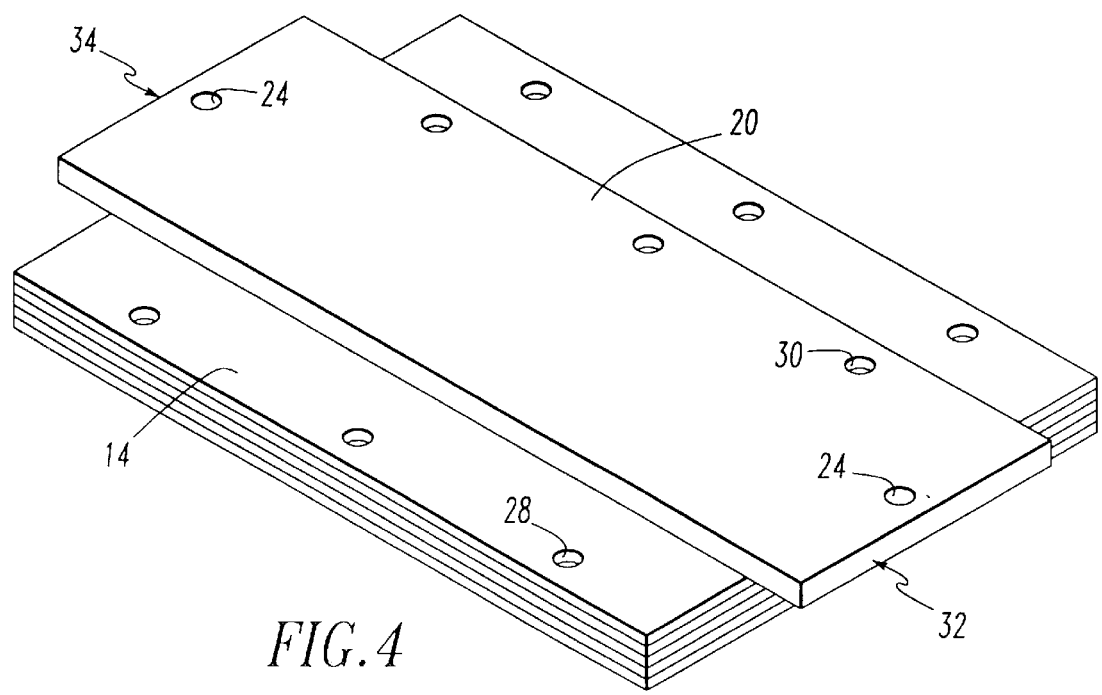

POST-FIRING METHOD FOR INTEGRATING PASSIVE DEVICES INTO CERAMIC ELECTRONIC PACKAGES

BACKGROUND OF THE INVENTION

1. Field of the Invention

The present invention relates to methods of integrating passive devices such as capacitors, resistors and circulators into ceramic packages of electronic systems, and more particularly to such methods in which the passive components are fired as separate entities prior to attachment to the separately fired ceramic package.

2. Description of the Prior Art

For applications requiring compact electronics such as airborne, space-based and certain consumer electronics, the bulk contributed by passive components such as capacitors that are mounted on the surface of the substrate is unacceptable. Due to improvements in semiconductor technology, electronic signal processing can now be done with very small chips in a minimum of space, and future systems will continue to demand miniaturization of the supporting components. Furthermore, wirebonds that are used to make electrical connections to surface-mounted components are a major source of failure, limiting system yield, lifetime and reliability.

A solution to this problem in ceramic packages is to integrate the passive components as part of the multilayered structure currently used to process and route the signal. For example, buried resistors are sufficiently well-developed that they are in fairly common use already. Using thick film technology, a metal oxide resistor pattern is screen-printed onto the appropriate ceramic layer while it is still in the unfired state. At this stage the ceramic is in the form of thin sheets of ceramic powder bonded together by organic binders such as vinyl. Such thin sheets are called ceramic tape.

Electrical connections to the printed resistors are made using metallizations applied on the ceramic tape via the same screen printing technology used for applying resistors. The layers of unfired ceramic tape are subsequently stacked, laminated, and fired into a solid, dense, ceramic package. The resistor is thus "buried" in the structure and electrically connected without using wirebonds.

Similarly, an integrated capacitor capability has been developed in the industry in which a "bank" of capacitors is fabricated using thin layers of a ceramic having suitable electrical properties, primarily high dielectric constant, K. Such high K ceramics are made into thin tape form, and metal electrodes are screen-printed onto each thin capacitor layer. The unfired multilayer capacitor bank is then laminated to the unfired multilayer dielectric ceramic tape portion of the package. The entire assembly is then "cofired", i.e., densified in one high-temperature firing that burns out the organics in all tapes and sinters the ceramic portions together.

However, if the dielectric ceramic and the capacitor ceramic do not exhibit the same densification behavior (e.g., densification rate, final densification temperature and thermal contraction upon cooling), then the package will fracture, warp, and/or fall apart. For example, a capacitor that has to be densified at 1000° C. and a ceramic that densifies at 850° C. cannot normally be fired together. Furthermore, with cofiring in which unfired low K and high K parts are pressed together and fired, if one of the parts is defective then the whole finished integrated structure must be thrown out. The parts cannot be tested electrically as separate units. In addition, the ceramics must not react adversely with one another at high temperatures; otherwise undesirable reaction products having the incorrect thermal contraction will occur, or the reaction will destroy the performance of the individual dielectric and capacitor sections of the package.

To mitigate these adverse reactions, intermediate "buffer" ceramic tapes have been developed for specific ceramic pairs of dielectric and capacitor tapes. In certain cases, the design of the structure is limited to a balanced sandwich to minimize the effects of shrinkage mismatch of different ceramic tapes. Furthermore, selection of the individual dielectric and capacitor materials is restricted to a small subset of potential candidate materials whose properties are suitable for the cofired integration process. Consequently, the best material alternatives that would provide maximum benefits in the integrated packages cannot be used.

Therefore, means of producing electronic packages having passive elements are needed in which materials having different densification rates may be integrated with one another. Such means should also allow different parts to be electrically tested separately.

SUMMARY OF THE INVENTION

A fabrication method is provided for integrating passive devices such as capacitors, resistors and circulators into ceramic packages for electronic systems.

The present invention integrates passive components by fabricating them as multilayered metallized tape structures. However, these components are fired as separate parts prior to attachment to the multilayer dielectric, which is also fired separately. Thus, the post firing method consists of subsequently attaching separately fired parts to one another by a third firing step after they have each already been fired to full density.

When the capacitor and the low K part are fired, they each undergo whatever shrinkage is characteristic of the respective materials. Therefore, metallization pattern designs are applied to the parts in which the patterns are tailored to the parts to match each part's characteristic amount of shrinkage. The metallization patterns are selected for each part so that the via holes or vertical interconnects would line up at the parts' surfaces after they are fired.

Then, a lower firing ceramic tape, preferably one or two thin sheets with the appropriate via holes is placed between the parts. Next, the whole assembly is fired as one unit and the internal ceramic material serves as an adhesive, resulting in a solid piece having a low K multilayered structure attached with ceramic bonding to a high K multilayered capacitor bank.

This post-fired integration approach has the advantage that each individual ceramic can be fired using a heating schedule that is optimized for that particular material, and selection of material is not constrained. For example, certain high K capacitor ceramics require prolonged heating at elevated temperatures to develop the grain structure that leads to the best electrical properties. It is best to fire these materials on an inert base, since long heating tends to promote diffusion of species, and chemical reaction with other ceramic dielectrics to form undesirable phases usually occurs if they are in contact with the capacitor bank. These reactions often defeat the purpose of the prolonged heating, ruining the electrical performance of the capacitor.

In other cases, the passive ceramic component may require a densification temperature that is above the melting point of the dielectric ceramic. This is the case with commercial ferrite circulators, which are densified at temperatures above 1300° C., whereas the ceramic packages that are compatible with high-conductivity metals such as gold and silver must be densified below 1000° C. (A circulator is a magnetic ceramic component that directs the electronic signal in a preferred direction within the electronic package.)

In still other cases, the thermal contraction differential between the passive component and the dielectric upon cooling from the firing temperature is too large to allow a large package to remain intact during attempts at cofiring these parts at the temperatures needed to densify both ceramics due to the large strain developed.

An important advantage of the post-fired approach is that individual functional fired ceramic parts can be tested electrically prior to joining, which eliminates the need to reject an entire cofired package just because one of the sections is not functioning correctly. This advantage is not to be overlooked, since the value of one such section can be many thousands of dollars.

The present preferred post-firing method thus includes the following steps. A first passive component is fired at a first densification temperature, sufficient to densify the multilayered structure. A second passive component is also fired at its densification temperature sufficient to densify the multilayered structure. At least one bonding layer is provided between and in contact with the first and second passive components. The bonding layer has a third densification temperature that is lower than the first densification temperature and the second densification temperature. Then, the first passive component, the second passive component and the bonding layers are fired at the third densification temperature. Preferably, at least two bonding layers are utilized in which at least one bonding layer is attached to the first component and at least bonding layer is attached to the second component.

One or more of the first and second components may be a capacitor, a resistor, a circulator or a similar passive component. In addition, one or more of the first and second components may be dielectric material.

It is preferred that the bonding layers are made of glass or glass/ceramic. The preferred densification temperature for the bonding layers is at least 100° C. below each of the first densification temperature and the second densification temperature. It is further preferred that the bonding layers exhibit a thermal expansion and contraction amount which is intermediate between the expansion and contraction amount exhibited by the first and second components at a temperature below the third densification temperature of the bonding layers. In addition, the bonding layers may be selected to exhibit a thermal expansion and contraction amount which is higher than the expansion and contraction amount exhibited by the first and second components, such that the first and second components are pulled into compression during heating at the third densification temperature.

The bonding layers are attached to the first and second components by any means but preferably through the use of an adhesive. The preferred adhesive is a polyvinyl alcohol. Further, the bonding layers may be attached to the first and second components in an unfired state. A metallization pattern may be provided on the bonding layers. It is preferred that pressure be applied between the first and second components with the bonding layers therebetween during firing of the structure at the third densification temperature. Alternatively, the bonding layers may be prefired to a temperature sufficient to remove organic components of the bonding layers. Such prefiring of the bonding layers is preferably carried out on a flat, nonreactive surface.

Other objects and advantages of the invention will become apparent from a description of certain present preferred embodiments thereof shown in the drawings.

BRIEF DESCRIPTION OF THE DRAWINGS

FIG. 3 is a perspective view of the multilayer passive component.

FIG. 4 is a perspective view of the multilayer passive component having a bonding layer attached thereto.

DETAILED DESCRIPTION OF THE PREFERRED EMBODIMENTS

Figure 1:
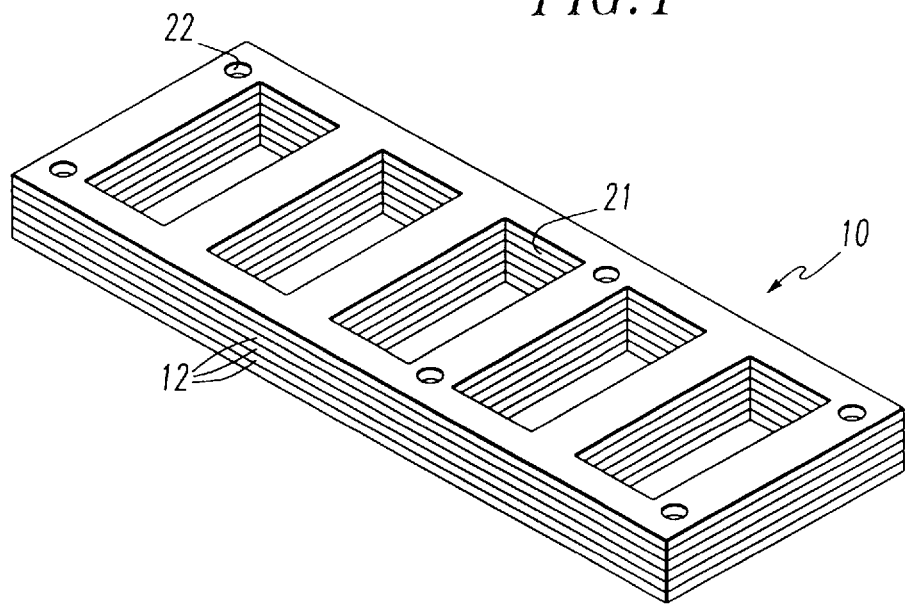
FIG. 1 is a perspective view of the multilayer dielectric component.

For post-fired integration, attachment of the pre-fired passive component to the pre-fired dielectric package is accomplished using a glass or glass/ceramic tape bonding layer whose softening point is below that of either of the ceramics being joined. This glass bonding tape is considered as part of the electronic package also in that the metal circuitry and through-hole (via) conductors are processed by punching and screen printing operations in the same manner as those used for the dielectric and passive components.

There are two possible methods of integration of dielectric and passive multilayer stacks using this bonding layer approach. The first is to simply use the metallized, unfired bonding tapes and to allow the organic components from the tape layers to be evolved during the bonding process thermal treatment. Using this approach, considerable care must be practiced to allow sufficient time in the liberation of the organics to prevent large gas evolution from disrupting the precise alignment of the electrical contacts. In addition, using this approach, the natural lateral shrinkage of the bonding tape layers must be inhibited to prevent cracking and misalignment of the electrical connections. This can be accomplished, for example, by using a weight to maintain pressure on the component stack.

Because of these potential problems during the bonding process, the preferred approach is to pre-fire the bonding layer tape (after completion of the hole-punching and metallization steps) to remove the organic binders and to allow the shrinkage process to proceed to a substantial extent whereby the majority of shrinkage of the bonding layer occurs. The temperature at which this pre-firing is carried out should be slightly below the bonding temperature but sufficiently high that shrinkage of the bonding layers is essentially completed. During pre-firing, the bonding layers must be supported on a flat support plate that will not react with or adhere to the bonding ceramic. Silicon carbide, silica, alumina, or zirconium oxide support plates work well with all of the materials investigated thus far.

The pre-fired bonding tape has sufficient rigidity that it can be readily handled in the subsequent integration of the dielectric and passive multilayer stacks, and because the organic components have been removed, the bonding operation can be performed in a rapid thermal treatment.

During the bonding process, alignment of the circuitry is achieved using through-holes (vias) in a layer of bonding tape which is lined up with features in each of the fired ceramic parts. Electrical connection is similarly achieved using through-holes that are filled with metallization. The bonding tape is spot-tacked in place using any compatible adhesive, e.g., polyvinyl alcohol. In this manner, a layer of binding tape is temporarily attached to the dielectric multilayer stack, with all the electrical connections in place, and a second bonding layer is similarly attached to the passive multilayer stack.

The bonding tapes are then aligned with one another through tabs that extend beyond the edges of the pre-fired ceramic parts to be joined. This is done using tooling pins placed in tooling holes that have been precision-punched in the tabs.

The aligned assembly is then heated for a relatively short time above the softening point of the bonding glass or glass/ceramic; this temperature is preferably at least one hundred degrees below the softening point of either of the prefired ceramic parts.

Upon cooling, thermal contraction compatibility becomes a factor at a temperature where the bonding layer "sets" or becomes rigid. Therefore, the bonding layer composition is selected from a wide variety of glasses and glass/ceramics such that its thermal contraction is between those of the parts being joined. This effectively "grades" the thermal contraction differences involved and permits the joining of individual ceramics that otherwise display differences in thermal contraction that preclude their attachment. Furthermore, if the glass/ceramic remains compliant to substantially low temperatures during cool-down from the bonding temperature, i.e., 400° to 500° C., then the temperature range over which thermal contraction strains could become significant is minimized. Many ceramics exhibit low thermal expansion in the low-temperature range and are therefore able to be joined by "post-fired" operations but cannot be cofired. The tabs previously used for alignment are quite thin and can be snapped off or cut off after the bonding operation is finished.

The post-fired approach to the integration of passive components is preferred to simply "gluing" using an organic adhesive, because such adhesives universally display very large thermal expansions that are not compatible with those of ceramic materials. Because of this incompatibility, heat that is dissipated during use of the electronic package causes failure of the bond in packages of substantial size. In addition, the alignment of the metal circuitry is less precise between the two ceramic layers since the ability to externally locate the two layers as in the present invention is not possible. This limits the complexity possible in the package, thus reducing its usefulness.

The post-fired integration method of the present invention will now be discussed with reference to FIGS. 1–5. First, a number of layers 12 are cut, shaped and stacked as shown in FIG. 1. The dielectric component layers 12 are then prefired to form a unitary dielectric component 10. It is understood that the dielectric component 10 may be any passive component. Preferably, the dielectric component 10 may have cavities 21 formed therethrough, such as by being formed in each layer 12. Vias 22 are also preferably provide through the dielectric component 10, such as by being formed through the dielectric component layers 12.

Figure 2:
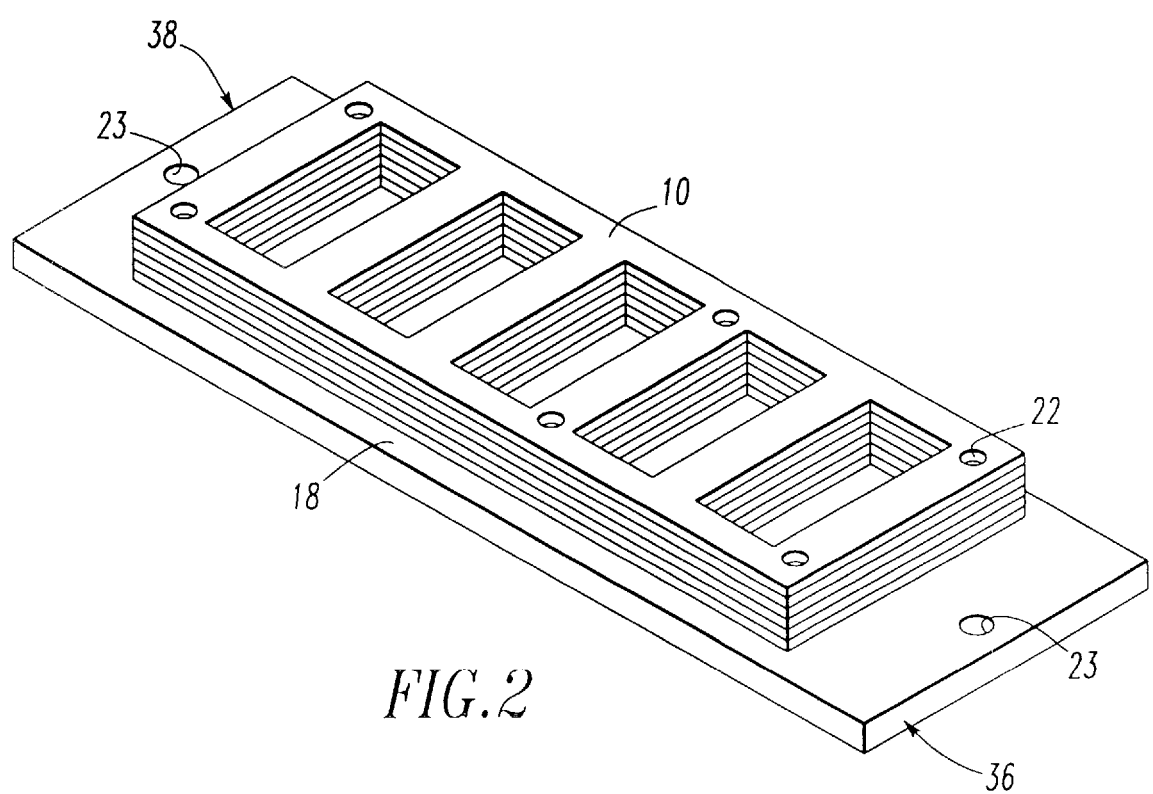
FIG. 2 is a perspective view of the multilayer dielectric component having a bonding layer attached thereto.

Referring next to FIG. 2, a bonding layer 18 is then adhered to the dielectric component 10. Preferably, the bonding layer 18 is attached to the dielectric component 10 by any suitable means such as through the use of an adhesive, e.g., polyvinyl alcohol. Although hidden from view in FIG. 2, the bonding layer 18 preferably also has vias (not shown) disposed therethrough which are alignable with the vias 22 of the dielectric component 10. In this way, the multilayer dielectric component 10 may be positively positioned with respect to the bonding layer 18 through alignment of the vias. As shown in FIG. 2, the bonding layer 18 has opposed ends 36, 38 which extend outward beyond the length of the dielectric component 10. Bonding layer 18 further has tooling pin openings 23 provided at its first and second ends 36, 38.

As can be seen in FIG. 3, a passive component 14 is also formed by stacking a number of layers 16. The passive component layers 16 are prefired so as to form a unitary passive component 14. The passive component 14 may be, for example, a capacitor bank. As can be seen in FIG. 3, the passive component 14 preferably has vias 28 provided therethrough.

Referring next to FIG. 4, a bonding layer 20 is attached to the passive component 14. The bonding layer 20 is attached to the passive component 14 by any suitable means, such as through the use of an adhesive, e.g., polyvinyl alcohol. Bonding layer 20 has one or more vias 30 disposed therethrough. As with the dielectric component 10 and its bonding layer 18, the passive component 14 and bonding layer 20 may be positively positioned with respect to one another by alignment of the vias 28 of the passive component 14 and the vias 30 of the bonding layer 20. As can be seen in FIG. 4, the bonding layer 20 has opposed ends 32, 34 which extend outward beyond the length of the passive component 14. Bonding layer 20 further has tooling pin openings 24 provided at its first and second ends 32, 34.

Figure 5:
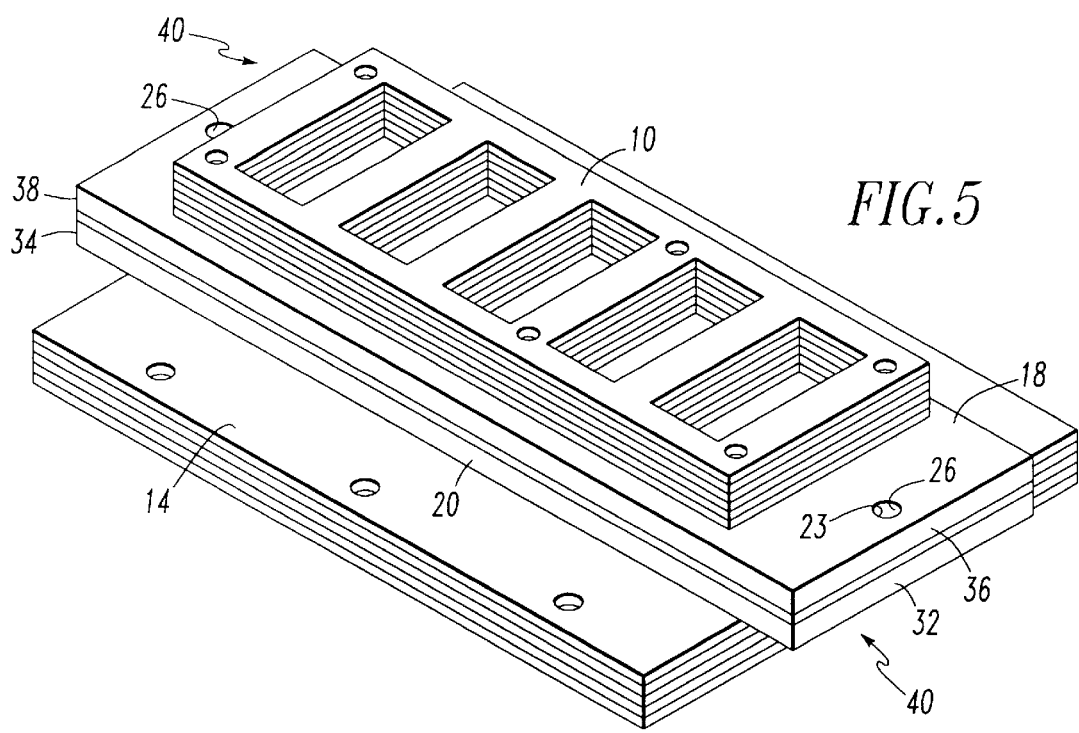
FIG. 5 is a perspective view of the multilayer dielectric component connected to the multilayer passive component through corresponding bonding layers.

Referring next to FIG. 5, bonding layer 18 is then aligned with bonding layer 20. Preferably, bonding layer 18 is aligned with bonding layer 20 by alignment of the tooling pin openings 23, 24. Once the bonding layers 18, 20 are aligned, the first end 36 of bonding layer 18 and the first end 32 of bonding layer 20 together form a tab 40 extending outward beyond the length of the components 10, 14. Likewise, the second end 38 of the bonding layer 18 and the second end 34 of bonding layer 20 form a tab 40 extending outward beyond the length of the components 10, 14. Furthermore, to prevent movement of the bonding layers 18, 22, tooling pins 26 are disposed through the aligned tooling pin openings 23, 24. Then, the entire structure is fired at a bonding temperature sufficient to densify the bonding layers 18, 20. After the entire structure is fired, the tabs 40 may be cut away.

It was experimentally shown that a metallized capacitor bank comprised of lead titanate/lead magnesium niobate ceramic can be integrated with a metallized borosilicate dielectric package by post-firing at 850° C. for 15 minutes using a boron aluminosilicate glass-ceramic as a bonding layer. Integrated packages of very large size (8×8 inches square, 58 layers thick) were fabricated in this manner. The amount of electrical connection was acceptable.

Conversely, the capacitor and dielectric ceramics were not able to be cofired because of adverse chemical reactions, differences in sintering rates, and differences in thermal contraction upon cooling from the required firing temperature of 980° C.

Figure 6:
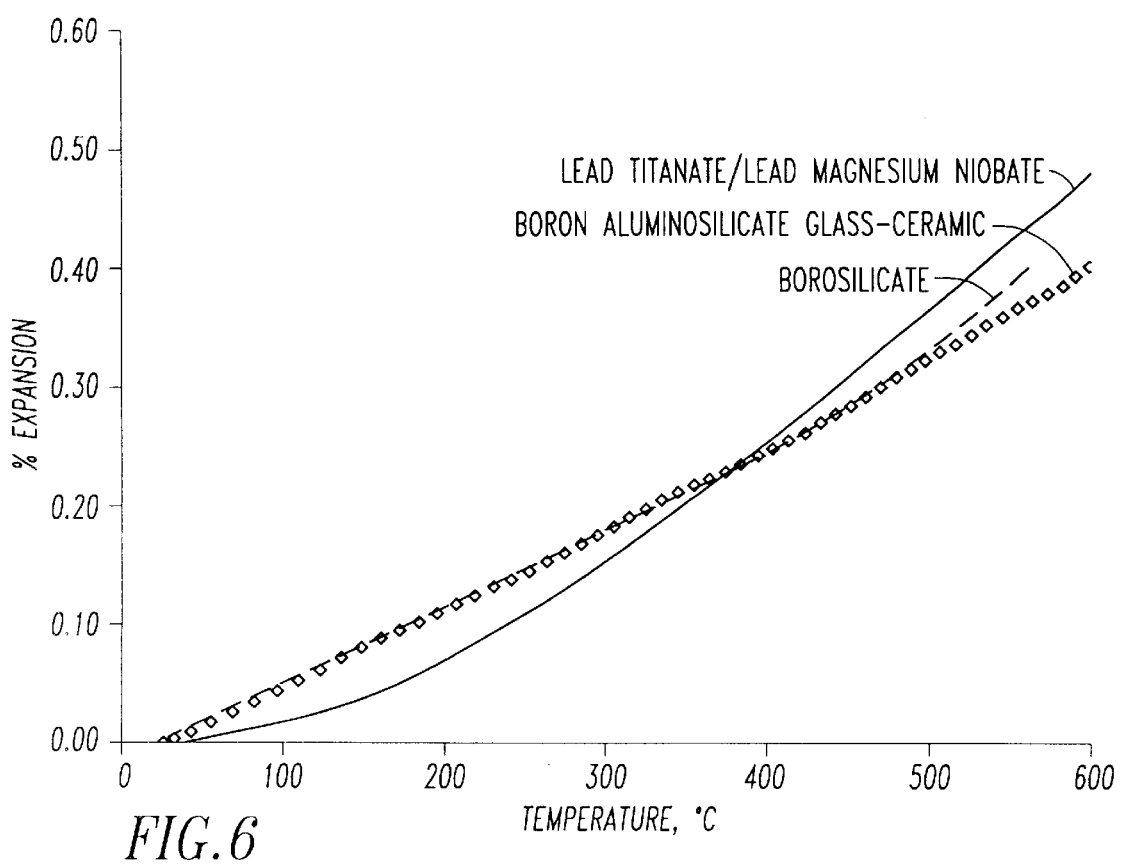
FIG. 6 is a graphical representation of the thermal expansion/contraction curves for a bonding layer material, a high K material and a low K material.

Thermal expansion/contraction curves for all three materials are shown in FIG. 6. The bonding layer softened at sufficiently low temperature and displayed a moderate contraction, which mitigated the problems encountered in cofiring.

While certain present preferred embodiments have been shown and described, it is distinctly understood that the invention is not limited thereto but may be otherwise embodied within the scope of the following claims.

We claim:

1. A post-firing method for integrating passive components with ceramic electronic packages, comprising the steps of:
   (a) firing a first passive component at a first densification temperature;
   (b) firing a second component constituting said electronic package at a second densification temperature;
   (c) providing at least one electrically insulating bonding layer having a plurality of metallized vias therethrough and positioning said at least one bonding layer between and in contact with the fired first and second components, wherein the at least one bonding layer has a third densification temperature lower than that of the first and second densification temperatures; and
   (d) heating the fired first passive component, the fired second component and the at least one bonding layer at the third densification temperature.

2. The method of claim 1 wherein the first component is made from the group consisting of at least one capacitor, at least one resistor and at least one circulator.

3. The method of claim 1 wherein at least one of the first and second components is a section of dielectric material.

4. The method of claim 1 wherein the at least one bonding layer is selected from the group consisting of glass and glass/ceramic.

5. The method of claim 4 wherein the at least one bonding layer third densification temperature is at least 100° C. below each of the first densification temperature and the second densification temperature.

6. The method of claim 4 wherein the at least one bonding layer exhibits a thermal expansion and contraction amount which is intermediate between an expansion and contraction amount exhibited by the first and second components at a temperature below the third densification temperature of the at least one bonding layer.

7. The method of claim 1 wherein the bonding layer exhibits a thermal expansion and contraction amount which is higher than an expansion and contraction amount exhibited by the first and second components, such that the first and second components are pulled into compression during heating of the first component, second component and the at least one bonding layer at the third densification temperature.

8. The method of claim 1 wherein the at least one bonding layer is attached to the first passive component and the second component by means of an adhesive.

9. The method of claim 1 wherein the at least one bonding layer is provided between the first and second components in step (c) in an unfired state.

10. The method of claim 9 wherein the unfired at least one bonding layer has a metallized pattern provided thereon.

11. The method of claim 10 further comprising the step of applying pressure between the first and second components and the at least one bonding layer during step (d).

12. The method of claim 1 wherein the at least bonding layer is provided between the first and second components in step (c) after prefiring the bonding layer to remove organic components.

13. The method of claim 12 wherein prefiring of the at least one bonding layer is sufficient to cause a majority of shrinkage of the bonding layer to occur.

14. The method of claim 13 wherein prefiring of the at least one bonding layer is carried out on a flat, nonreactive surface.

15. The method of claim 12 wherein metal conductor patterns are provided on the first and second components, and wherein alignment of the metal conductor patterns is accomplished by alignment holes disposed in tabs of the at least one bonding layer that extend outward from the first and second components.

16. The method of claim 15 further comprising the step of cutting of the tabs after the first component, second component and the at least one bonding layer are heated.

17. The method of claim 1 wherein the at least one bonding layer is comprising of a single sheet of material.

18. The method of claim 1 wherein the at least one bonding layer is comprised of a plurality of sheets of material, such that at least one bonding layer is attached to the first component and at least one bonding layer is attached to the second component and wherein the first components at least one bonding layer and the second components at least one bonding layer are placed in contact during step (d).

* * * * *